US009646821B2

(12) United States Patent
Yamamoto et al.

(10) Patent No.: US 9,646,821 B2
(45) Date of Patent: May 9, 2017

(54) METHOD OF MANUFACTURING SEMICONDUCTOR DEVICE (71) Applicant: Hitachi Kokusai Electric Inc., Tokyo (JP)

(72) Inventors: Tetsuo Yamamoto, Toyama (JP); Tsutomu Kato, Toyama (JP); Satoshi Okada, Toyama (JP); Yuji Takebayashi, Toyama (JP)

(73) Assignee: Hitachi Kokusai Electric, Inc., Tokyo (JP)

( * ) Notice: Subject to any disclaimer, the term of this patent is extended or adjusted under 35 U.S.C. 154(b) by 0 days.

(21) Appl. No.: 14/622,126

(22) Filed: Feb. 13, 2015

(65) Prior Publication Data
US 2015/0162184 A1 Jun. 11, 2015

Related U.S. Application Data (62) Division of application No. 13/687,709, filed on Nov. 28, 2012.

(30) Foreign Application Priority Data

Nov. 29, 2011 (JP) ................. 2011-260937

(51) Int. Cl.
H01L 21/02 (2006.01)
H01L 21/67 (2006.01)
(Continued)

(52) U.S. Cl.
CPC .... H01L 21/0228 (2013.01); H01L 21/02189 (2013.01); H01L 21/02225 (2013.01);
(Continued)

(58) Field of Classification Search
CPC ..... C23C 16/45525–16/45551; H01L 21/0228
See application file for complete search history.

(56) References Cited

U.S. PATENT DOCUMENTS 2,863,563 A 12/1958 Ellis et al.
4,343,771 A 8/1982 Edwards et al.
(Continued)

FOREIGN PATENT DOCUMENTS

JP 07-170245 7/1995
JP 2000-044385 A 2/2000
JP 2010050439 3/2010

OTHER PUBLICATIONS

Office Action in corresponding Japanese Application No. 2011-260937, dated Jun. 19, 2015, along with English translation.

Primary Examiner — Elizabeth Burkhart
(74) Attorney, Agent, or Firm — Edell, Shapiro & Finnan LLC (57) ABSTRACT A method of manufacturing a semiconductor device includes processing a substrate accommodated in a process container accommodated in a housing by supplying a process gas onto the substrate; and exhausting the process container using an exhaust system comprising a first exhaust pipe connected to the process container, the first exhaust pipe having circular or oval cross-section perpendicular to an exhausting direction thereof; and a second exhaust pipe connected to the first exhaust pipe, the second exhaust pipe having square or rectangular cross-section perpendicular to the exhausting direction, wherein at least a portion of the second exhaust pipe is disposed within the housing.

6 Claims, 9 Drawing Sheets (51) Int. Cl.
*H01L 49/02* (2006.01)
*H01L 27/108* (2006.01)

(52) U.S. Cl.
CPC .. *H01L 21/67017* (2013.01); *H01L 21/67109* (2013.01); *H01L 27/108* (2013.01); *H01L 28/40* (2013.01)

(56) References Cited

U.S. PATENT DOCUMENTS

| | | | |
|---|---|---|---|
| 5,116,784 A * | 5/1992 | Ushikawa | H01L 21/02532 118/50 |
| 5,401,212 A | 3/1995 | Marvell et al. | |
| 5,415,585 A | 5/1995 | Miyagi | |
| 5,536,321 A | 7/1996 | Olsen et al. | |
| 6,045,618 A | 4/2000 | Raoux et al. | |
| 6,063,197 A | 5/2000 | Cox et al. | |
| 6,099,649 A | 8/2000 | Schmitt et al. | |
| 6,156,107 A | 12/2000 | Hayashi et al. | |
| 6,328,777 B1 | 12/2001 | Benthaus et al. | |
| 6,332,925 B1 | 12/2001 | Noji et al. | |
| 2002/0006477 A1 * | 1/2002 | Shishido | C23C 14/564 427/569 |
| 2002/0092421 A1 | 7/2002 | Hayes et al. | |
| 2002/0100417 A1 * | 8/2002 | Suzuki | C23C 16/4412 118/715 |
| 2003/0037730 A1 | 2/2003 | Yamasaki et al. | |
| 2003/0164225 A1 * | 9/2003 | Sawayama | C23C 16/24 156/345.29 |
| 2004/0124131 A1 | 7/2004 | Aitchison et al. | |
| 2005/0016453 A1 | 1/2005 | Seidel et al. | |
| 2006/0207314 A1 | 9/2006 | Kitazawa et al. | |
| 2008/0171131 A1 * | 7/2008 | Moro | C23C 14/541 427/8 |
| 2009/0074964 A1 | 3/2009 | Lindfors et al. | |
| 2009/0217634 A1 | 9/2009 | Choi | |
| 2010/0012292 A1 | 1/2010 | Yamazaki | |
| 2010/0083898 A1 * | 4/2010 | Kogura | C23C 16/405 118/692 |
| 2010/0159122 A1 | 6/2010 | Hosoi et al. | |
| 2011/0259521 A1 | 10/2011 | Hyakutake et al. | |

* cited by examiner

METHOD OF MANUFACTURING SEMICONDUCTOR DEVICE

CROSS REFERENCE TO RELATED APPLICATIONS

This application is a divisional of U.S. patent application Ser. No. 13/687,709 filed Nov. 28, 2012, entitled "Exhaust Unit, Substrate Processing Apparatus, and Method of Manufacturing Semiconductor Device," which claims foreign priority under 35 U.S.C. §119(a)-(d) to Japanese Application No. JP 2011-260937 filed on Nov. 29, 2011, entitled "Exhaust Unit, Substrate Processing Apparatus, and Method of Manufacturing Semiconductor Device," the entire contents of which are hereby incorporated by reference.

FIELD OF THE INVENTION

The present invention relates to a substrate processing apparatus, and more particularly, to a substrate processing apparatus capable of processing a semiconductor silicon wafer.

BACKGROUND

A substrate processing apparatus for manufacturing a capacitor used in a semiconductor device such as a dynamic random access memory (DRAM) on a substrate such as a semiconductor silicon wafer is disclosed in Japanese Patent Application Laid-Open No. 2010-50439.

Recently, semiconductor devices are miniaturized, and a substrate processing apparatus for manufacture the semiconductor devices is required to have a low inside pressure in order to improve gas adsorption characteristics according to the miniaturization. Although it is efficient to increase an exhaust speed of a vacuum pump in order to achieve lower inside pressure, it is also necessary to improve a conductance of the exhaust system due to the variation of the exhaust speed of the substrate processing apparatus being dependent upon the conductance of the exhaust system. However, enlarging the diameter of the conventional exhaust system so as to increase the conductance thereof results in a large footprint of the substrate processing apparatus.

SUMMARY

The present invention is directed to providing a substrate processing apparatus with increased conductance of an exhaust system while preventing or suppressing an increase in footprint thereof, thereby reducing an inner pressure thereof.

According to one aspect of the present invention, there is provided an exhaust unit including a first exhaust pipe connected to a process container configured to accommodate and process a substrate, the first exhaust pipe having circular or oval cross-section perpendicular to an exhausting direction thereof; and a second exhaust pipe connected to the first exhaust pipe, the second exhaust pipe having square or rectangular cross-section perpendicular to the exhausting direction.

According to another aspect of the present invention, there is provided a substrate processing apparatus including a process container configured to accommodate a substrate; a process gas supply system configured to supply a process gas for processing the substrate into the process container; and an exhaust system configured to exhaust the process container, wherein the exhaust system includes: a first exhaust pipe connected to the process container, the first exhaust pipe having circular or oval cross-section perpendicular to an exhausting direction thereof; and a second exhaust pipe connected to the first exhaust pipe, the second exhaust pipe having square or rectangular cross-section perpendicular to the exhausting direction.

According to still another aspect of the present invention, there is provided a method of manufacturing a semiconductor device, the method including processing a substrate accommodated in a process container by supplying a process gas onto the substrate; and exhausting the process container using an exhaust system including a first exhaust pipe connected to the process container, the first exhaust pipe having circular or oval cross-section perpendicular to an exhausting direction thereof; and a second exhaust pipe connected to the first exhaust pipe, the second exhaust pipe having square or rectangular cross-section perpendicular to the exhausting direction.

According to yet another aspect of the present invention, there is provided a substrate processing apparatus including a process chamber configured to accommodate a plurality of substrates stacked together, a process gas supply unit configured to supply a process gas for processing the plurality of substrates into the process chamber, and an exhaust unit configured to exhaust the process chamber. The exhaust unit includes a vacuum pump, and exhaust pipes configured to connect the process chamber and the vacuum pump. At least a portion of the exhaust pipes has a rib structure and includes pipes in which cross-sections perpendicular to an exhaust direction have rectangular or oval shaped portions

DETAILED DESCRIPTION

Hereinafter, a substrate processing apparatus according to an exemplary embodiment of the present invention will be described with reference to the accompanying drawings. In one embodiment, the substrate processing apparatus is configured as a semiconductor manufacturing apparatus to perform a film forming process as a substrate processing process used in a method of manufacturing an integrated circuit (IC) as a semiconductor device. In addition, in the following disclosure, a case in which a batch-type vertical apparatus is used as a substrate processing apparatus (hereinafter also referred to simply as a 'processing apparatus') to perform oxidation, nitridation, diffusion, or chemical vapor deposition (CVD) on a substrate will be described.

Figure 1:
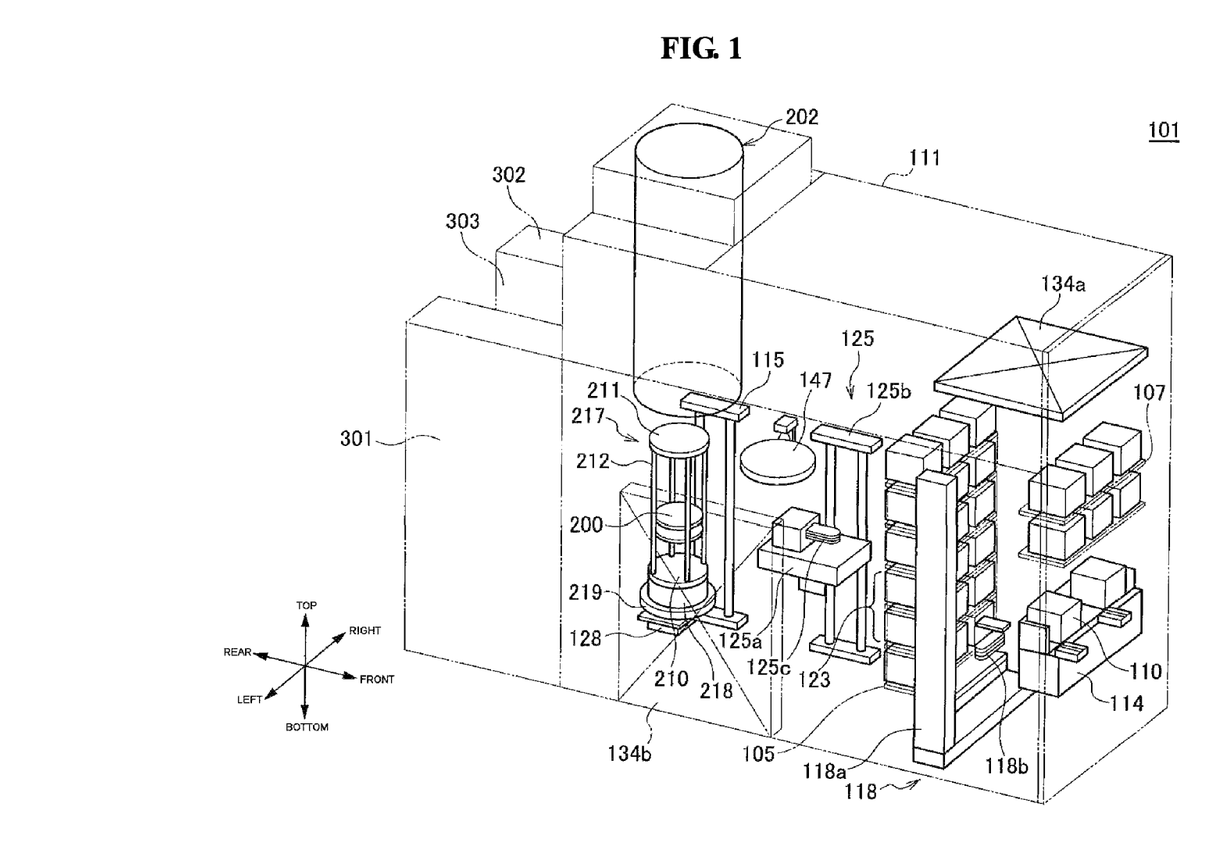
FIG. 1 is a perspective view schematically illustrating a substrate processing apparatus according to an embodiment of the present invention.

Referring to FIG. 1, in a substrate processing apparatus 101, a cassette 110 accommodating a substrate, e.g., a wafer 200, is used, and the wafer 200 is made of semiconductor silicon or the like. The substrate processing apparatus 101 includes a housing 111, and a cassette stage 114 is installed in the housing 111. The cassette 110 is loaded onto or unloaded from the cassette stage 114 by a carrying device (not shown) during a process.

The cassette 110 is placed on the cassette stage 114 by the carrying device in a manner that the wafer 200 in the cassette 110 is retained in a vertical posture and a wafer entrance of the cassette 110 is disposed upward. The cassette stage 114 is configured in a manner that the cassette 110 is vertically rotated 90° toward the rear of the housing 111 to arrange the wafer 200 in the cassette 110 to have a horizontal posture, thereby allowing the wafer entrance of the cassette 110 to face the rear of the housing 111.

A cassette shelf 105 is installed approximately at a center of the housing 111 with respect to a forward-backward direction. The cassette shelf 105 includes a plurality of columns and a plurality of rows to store the cassettes 110 therein. In the cassette shelf 105, a transfer shelf 123 is installed to accommodate the cassette 110 that is to be carried via a wafer transfer mechanism 125.

A preparatory cassette shelf 107 is installed above the cassette stage 114 to preparatorily store the cassette 110.

A cassette carrying device 118 is installed between the cassette stage 114 and the cassette shelf 105. The cassette carrying device 118 includes a cassette elevator 118a that is movable upward/downward while retaining the cassette 110, and a cassette carrying mechanism 118b as a carrying mechanism. The cassette carrying device 118 is configured in a manner that the cassette 110 is carried among the cassette stage 114, the cassette shelf 105, the preparatory cassette shelf 107 and the transfer shelf 123 through an association with the cassette elevator 118a and the cassette carrying mechanism 118b.

The wafer transfer mechanism 125 is installed at the rear of the cassette shelf 105. The wafer transfer mechanism 125 includes a wafer transfer device 125a that can rotate the wafer 200 horizontally or move the wafer 200 in a straight direction, and a wafer transfer device elevator 125b that moves the wafer transfer device 125a upward/downward. Tweezers 125c are installed on the wafer transfer device 125a to pick up and retain the wafer 200 in a horizontal posture. The wafer transfer device 125a is configured in a manner that the wafer 200 is loaded (charged) into a boat 217 from the cassette 110 on the transfer shelf 123 or is unloaded (discharged) from the boat 217 to be accommodated in the cassette 110 on the transfer shelf 123 using the tweezers 125c as a unit for placing the wafer 200 through an association with the wafer transfer device 125a and the wafer transfer device elevator 125b.

A process furnace 202 is installed on an upper portion of a rear part of the housing 111 to thermally treat the wafer 200, and a lower end of the process furnace 202 is configured to be opened and closed by a furnace port shutter 147.

A boat elevator 115 is installed below the process furnace 202 to move the boat 217 upward/downward with respect to the process furnace 202. A platform of the boat elevator 115 is connected to an arm 128, and a seal cap 219 is installed parallel to the arm 128. The seal cap 219 is configured to vertically support the boat 217 and block the lower end of the process furnace 202.

The boat 217 includes a plurality of retaining members, and is configured to horizontally retain a plurality of wafers 200 (e.g., about 50 to 150 wafers) in a state where the plurality of wafers 200 are concentrically arranged in a vertical direction.

A cleaning unit 134a that supplies clean air (clean atmosphere) is installed above the cassette shelf 105. The cleaning unit 134a includes a supply fan (not shown) and a dust filter (not shown), and is configured to circulate clean air within the housing 111.

A cleaning unit 134b that supplies clean air is installed at a left end of the housing 111. The cleaning unit 134b also includes a supply fan (not shown) and a dust filter (not shown), and is configured to circulate clean air near the wafer transfer device 125a, the boat 217, or the like. The clean air is circulated near the wafer transfer device 125a or the boat 217 and is then exhausted from the housing 111.

The housing 111 includes rear parts 301 and 302 at a rear side thereof. A space between the rear parts 301 and 302 is used as a maintenance space 303 for maintenance of the substrate processing apparatus 101.

A main operation of the substrate processing apparatus 101 will now be described.

When the cassette 110 is loaded onto the cassette stage 114 by the carrying device (not shown), the cassette 110 is placed on the cassette stage 114 in a manner that the wafer 200 is retained on the cassette stage 114 in a vertical posture and the wafer entrance of the cassette 110 faces upward. The cassette 110 is then vertically rotated 90° toward the rear of the housing 111 by the cassette stage 114 such that the wafer 200 in the cassette 110 is disposed in a horizontal posture and the wafer entrance of the cassette 110 faces the rear of the housing 111.

Thereafter, the cassette 110 is automatically carried to a predetermined shelf position at the cassette shelf 105 or the preparatory cassette shelf 107 by the cassette carrying device 118, is temporarily stored at the predetermined shelf position, and is then transferred to the transfer shelf 123 from the cassette shelf 105 or the preparatory cassette shelf 107 by the cassette carrying device 118 or is directly carried to the transfer shelf 123.

When the cassette 110 is transferred to the transfer shelf 123, the wafer 200 is picked up from the cassette 110 via the wafer entrance of the cassette 110 using the tweezers 125c of the wafer transfer device 125a, and is loaded (charged) into the boat 217 through an association with the wafer transfer device 125a and the wafer transfer device elevator 125b. The wafer transfer device 125a that transfers the wafer 200 to the boat 217 is returned to the cassette 110 so as to load a subsequent wafer 200 into the boat 217.

When a predetermined number of the wafers 200 are loaded into the boat 217, the furnace port shutter 147 that blocks the lower end of the process furnace 202 is opened to expose the lower end of the process furnace 202. The boat 217 retaining the predetermined number of the wafers 200 is then loaded into the process furnace 202 by a lifting movement of the boat elevator 115, and the lower end of the process furnace 202 is blocked by the seal cap 219.

After the boat 217 is loaded, a predetermined treatment is performed on the wafers 200 in the process furnace 202. Thereafter, the wafers 200 and the cassette 110 are unloaded from the housing 111 in reverse order.

The process furnace 202 used in the substrate processing apparatus 101 described above will now be described with reference to FIG. 2.

Figure 2:
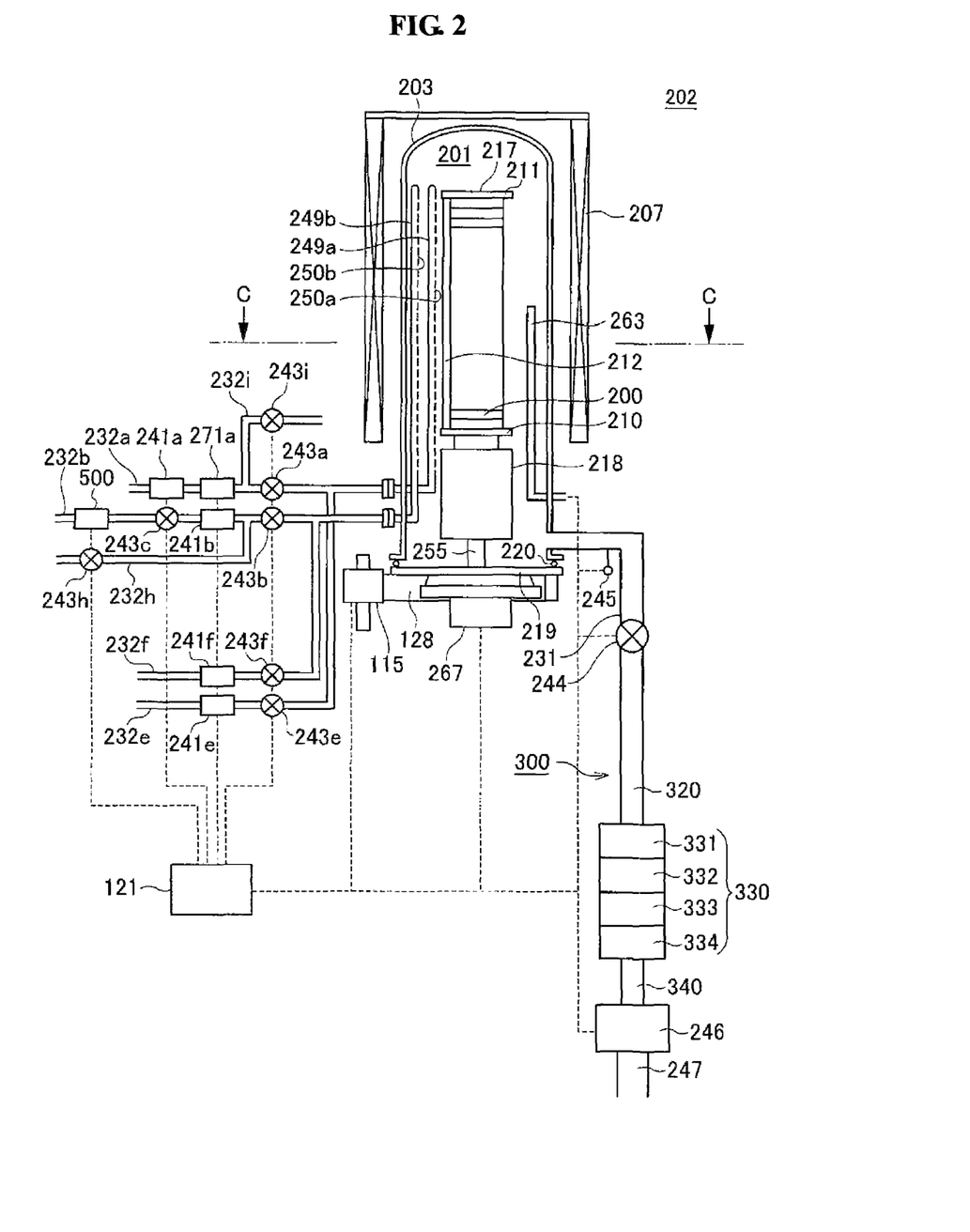
FIG. 2 is a schematic configuration diagram schematically exemplifying a process furnace and accompanying members thereof in a substrate processing apparatus according to an embodiment of the present invention wherein a longitudinal cross-sectional view of a process furnace portion is schematically shown.
Figure 3:
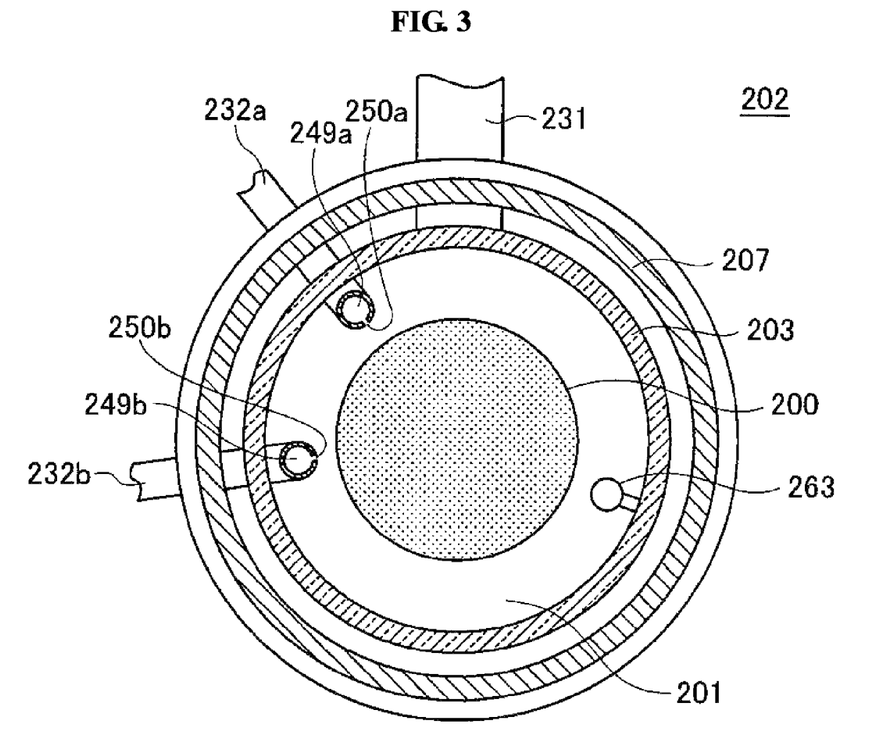
FIG. 3 is a lateral cross-sectional view illustrating the process furnace of FIG. 2 taken along line C-C.

Referring to FIG. 2, a heater 207 which is a heating device (heating means) for heating the wafers 200 is installed in the process furnace 202. The heater 207 includes a cylindrical insulating member with the top being closed and a plurality of heater wires, and has a unit structure in which the plurality of heater wires are installed with respect to the insulating member. The heater 207 is installed vertically while being supported by a heater base (not shown) as a retaining plate. In addition, a heating power source (not shown) that supplies power to the heater 207 is installed. Inside the heater 207, a reaction tube 203 made of quartz forming a reaction container (process container) for processing the wafer 200 is installed concentrically with the heater 207.

The seal cap 219 is installed below the reaction tube 203 as a furnace port lid capable of air-tightly sealing an aperture in a lower end of the reaction tube 203. The seal cap 219 is configured to vertically abut the lower end of the reaction tube 203. The seal cap 219 is made of a metal such as stainless steel, and has a disc shape. A sealing member (hereinafter referred to as an 'O-ring') 220 is disposed between a ring-shaped flange installed on an end of the aperture in the lower end of the reaction tube 203 and an upper surface of the seal cap 219 to air-tightly seal the ring-shaped flange and the upper surface of the seal cap 219. At least the reaction tube 203 and the seal cap 219 forms a process chamber 201.

A boat support 218 supporting the boat 217 is installed on the seal cap 219. The boat support 218 is made of a heat-resistant material such as quartz or silicon carbide, and functions as both an insulating member and a supporting member. The boat 217 is made of a heat-resistant material such as quartz or silicon carbide. The boat 217 includes a bottom board 210 fixed onto the boat support 218, a top board 211 disposed above the bottom board 210 and a plurality of pillars 212 installed between the bottom board 210 and the top board 211 (see FIG. 1). The plurality of wafers 200 are retained in the boat 217. The plurality of wafers 200 are stacked in multistage and arranged concentrically in a tube axial direction of the reaction tube 203, and supported by the pillars 212 of the boat 217 while the wafers 200 are retained at predetermined intervals and in a horizontal posture.

A rotation mechanism 267 that rotates the boat 217 is installed at a side of the seal cap 219 opposite to the process chamber 201. A rotation shaft 255 of the rotation mechanism 267 is connected to the boat support 218 through the seal cap 219, and rotates the plurality of wafers 200 by rotating the boat 217 via the boat support 218 by the rotation mechanism 267 so as to improve uniformity of substrate processing.

The seal cap 219 can be moved upward or downward by the boat elevator 115 which is a lifting mechanism installed outside the reaction tube 203, thereby loading the boat 217 into or unloading the boat 217 from the process chamber 201.

The boat 217 supported by the boat support 218 is loaded into the process chamber 218 while the plurality of wafers 200 to be batch-processed are stacked in multistage with respect to the boat 217. The process furnace 202 is configured in a manner that the plurality of wafers 200 inserted into the process chamber 201 are heated to a predetermined temperature by the heater 207.

In the process chamber 201, a nozzle 249a and a nozzle 249b are installed below the reaction tube 203 to pass through the reaction tube 203. The nozzles 249a and 249b are connected to a gas supply pipe 232a and a gas supply pipe 232b, respectively. The two nozzles 249a and 249b and the two gas supply pipes 232a and 232b are installed in the reaction tube 203 so that a plurality of types of gases may be supplied into the process chamber 201. In addition, as will be described below, the gas supply pipe 232a and the gas supply pipe 232b are connected to an inert gas supply pipe 232e and an inert gas supply pipe 232f, respectively.

A mass flow controller (MFC) 241a which is a flow rate controller (flow rate control unit), a vaporizer 271a which is a vaporizing device (vaporizing means) for generating a vapor gas as a source gas by vaporizing a liquid source, and a valve 243a which is a opening/closing valve are sequentially installed at the gas supply pipe 232a from an upstream side to a downstream side. The vapor gas generated in the vaporizer 271a is supplied into the process chamber 201 via the nozzle 249a by opening the valve 243a. A vent line 232i connected to an exhaust pipe 247 which will be described later is connected to the gas supply pipe 232a between the vaporizer 271a and the valve 243a. A valve 243i which is a opening/closing valve is installed in the vent line 232i to supply a source gas to the vent line 232i via the valve 243i when the source gas is not supplied into the process chamber 201. The supply of the vapor gas into the process chamber 201 may be discontinued while continuously generating the vapor gas by the vaporizer 271a by closing the valve 243a and opening the valve 243i. Although it takes considerable time to safely generate the vapor gas, it may take a very short time to switch between supplying the vapor gas into the process chamber 201 and discontinuing the supply of the vapor gas by opening and closing the valve 243a and the valve 243i. In addition, the inert gas supply pipe 232e is connected to the gas supply pipe 232a at a downstream side of the valve 243a. An MFC 241e which is a flow rate controller (flow rate control unit) and a valve 243e which is a opening/closing valve are sequentially installed at the inert gas supply pipe 232e from an upstream side to a downstream side.

The nozzle 249a described above is connected to a front end of the gas supply pipe 232a. The nozzle 249a is installed in an arc-shaped space between an inner wall of the reaction tube 203 and the wafers 200 and extends from a lower portion to an upper portion of the inner wall of the reaction tube 203 in a stacking direction. The nozzle 249a may be an L-shaped long nozzle. Gas supply holes 250a are disposed on a side surface of the nozzle 249a to supply a gas. The gas supply holes 250a are open toward a center of the reaction tube 203. The gas supply holes 250a are disposed from the lower portion to the upper portion of the reaction tube 203, and have the same opening area and the same pitch.

The gas supply pipe 232a, the vent line 232i, the valves 243a and 243i, the vaporizer 271 a, the MFC 241a and the nozzle 249a constitutes a first gas supply system. In addition, the inert gas supply pipe 232e, the MFC 241e and the valve 243e constitutes a first inert gas supply system.

An ozonizer 500 which generates ozone (O3) gas, a valve 243c, an MFC 241b which is flow rate controller (flow rate control unit), and a valve 243b which is a opening/closing valve are sequentially installed at the gas supply pipe 232b to an upstream side to a downstream side. An upstream side of the gas supply pipe 232b is connected to an oxygen gas supply source (not shown) that supplies oxygen (O2) gas. Oxygen (O2) gas supplied to the ozonizer 500 is changed into ozone (O3) gas by the ozonizer 500 and then supplied into the process chamber 201. A vent line 232h connected to the exhaust pipe 247 which will be described later is connected to the gas supply pipe 232b between the MFC 241b and the valve 243b. A valve 243h which is a opening/closing valve is installed at the vent line 232h to supply a source gas into the vent line 232h via the valve 243h when the ozone (O3) gas is not supplied into the process chamber 201. By closing the valve 243b and opening the valve 243h, the supply of the ozone (O3) gas into the process chamber 201 may be discontinued while the ozone (O3) gas is continuously generated by the ozonizer 500. Although it takes considerable time to safely refine the ozone (O3) gas, it may take a very short time to switch between supplying the ozone (O3) gas into the process chamber 201 and discontinuing the supply of the ozone (O3) gas by opening and shutting the valve 243b and the valve 243h. In addition, the inert gas supply pipe 232f is connected to the gas supply pipe 232b at a downstream side of the valve 243b. An MFC 241f which is a flow rate controller (flow rat control unit) and a valve 243f which is a opening/closing valve are sequentially installed at the inert gas supply pipe 232f from an upstream side to a downstream side.

The nozzle 249b described above is connected to a front end of the gas supply pipe 232b. The nozzle 249b is installed in an arc-shaped space between an inner wall of the reaction tube 203 and the wafers 200 and extends from a lower portion to an upper portion of the inner wall of the reaction tube 203 in a stacking direction. The nozzle 249b may be an L-shaped long nozzle. Gas supply holes 250b are disposed on a side surface of the nozzle 249b to supply a gas. The gas supply holes 250b are open toward the center of the reaction tube 203. The gas supply holes 250b are disposed from the lower portion to the upper portion of the reaction tube 203, and have the same opening area and the same pitch.

The gas supply pipe 232b, the vent line 232h, the ozonizer 500, the valves 243c, 243b, and 243h, the MFC 241b and the nozzle 249b constitutes a second gas supply system. In addition, the inert gas supply pipe 232f, the MFC 241f and the valve 243f constitutes a second inert gas supply system.

A zirconium source gas, i.e., a gas containing zirconium (Zr) (zirconium-containing gas) is supplied as a source gas into the process chamber 201 via the gas supply pipe 232a, the MFC 241a, the vaporizer 271a, the valve 243a and the nozzle 249a. For example, tetrakis(ethylmethylamino)zirconium (TEMAZ) gas may be used as the zirconium-containing gas. In addition, the source gas may be in a solid, liquid or gaseous state at a room temperature and atmospheric pressure. However, the source gas is assumed to be in the liquid state hereinafter. When the source gas is in the gaseous state at the room temperature and atmospheric pressure, the vaporizer 500 is not required.

A gas containing oxygen (O) (oxygen-containing gas) such as oxygen (O2) gas is supplied to the gas supply pipe 232b, changed into ozone (O3) gas by the ozonizer 500, and then supplied as an oxidizing gas (oxidizing agent) into the process chamber 201 via the valve 243c, the MFC 241b, the valve 243b and the nozzle 249b. Alternatively, the oxygen (O2) gas may be supplied as the oxidizing gas into the process chamber 201 without generating the ozone (O3) gas by the ozonizer 500.

Nitrogen (N2) gas, for example, is supplied into the process chamber 201 via the inert gas supply pipes 232e and 232f, the MFCs 241e and 241f, the valves 243e and 243f, the gas supply pipes 232a and 232b and the nozzles 249a and 249b.

In the reaction tube 203, a temperature sensor 263 is installed as a temperature detector. The temperature sensor 263 is configured to control an amount of current to be supplied to the heater 207 based on temperature information detected by the temperature sensor 263 so that inside temperature of the process chamber 201 may have a desired temperature distribution. The temperature sensor 263 has an L-shape similar to the nozzles 249a and 249b, and is installed along the inner wall of the reaction tube 203.

An exhaust system 300 is installed in the reaction tube 203 to exhaust the atmosphere in the process chamber 201. An exhaust pipe 231, an auto pressure controller (APC) valve 244 which is a pressure adjustor (pressure adjustment unit), an exhaust pipe 320, an exhaust pipe 330, an exhaust pipe 340, a vacuum pump 246 which is a vacuum exhaust device and the exhaust pipe 247 are sequentially installed at the exhaust system 300 from an upstream side (a process chamber side) to a downstream side. A pressure sensor 245 is installed as a pressure detector (pressure detection unit) at the exhaust pipe 231 to detect inside pressure of the process chamber 201. The exhaust pipe 247 installed at a downstream side of the vacuum pump 246 is connected to a waste gas processing device (not shown). The exhaust system 300 is configured to vacuum-exhaust an inside of the process chamber 201 such that inside pressure of the process chamber 201 is at a predetermined pressure (degree of vacuum). The APC valve 243 is a opening/closing valve configured to start or suspend the vacuum-exhaust of the process chamber 201 by opening/closing, and to adjust the pressure in the process chamber 201 by controlling the degree of opening and a conductance thereof A controller 121 which is a control unit (control member) is connected to the MFCs 241a, 241b, 241e and 241f, the valves 243a, 243b, 243c, 243e, 243f, 243h, and 243i, the vaporizer 271a, the ozonizer 500, the pressure sensor 245, the APC valve 244, the vacuum pump 246, the heating power source (not shown), the temperature sensor 263, the boat rotation mechanism 267 and the boat elevator 115. The controller 121 controls flow rates of various gases by controlling the MFCs 241a, 241b, 241e and 241f; controls opening/closing of the valves 243a, 243b, 243c, 243e, 243f, 243h and 243i; controls opening/closing of the APC valve 244; controls the degree of pressure using the pressure sensor 245; controls temperature of the heater 207 using the temperature sensor 263; controls the vaporizer 271a and the ozonizer 500; controls driving/suspending of the vacuum pump 246; controls a rotation speed of the boat rotation mechanism 267; and controls a lifting operation of the boat elevator 115.

Figure 4:
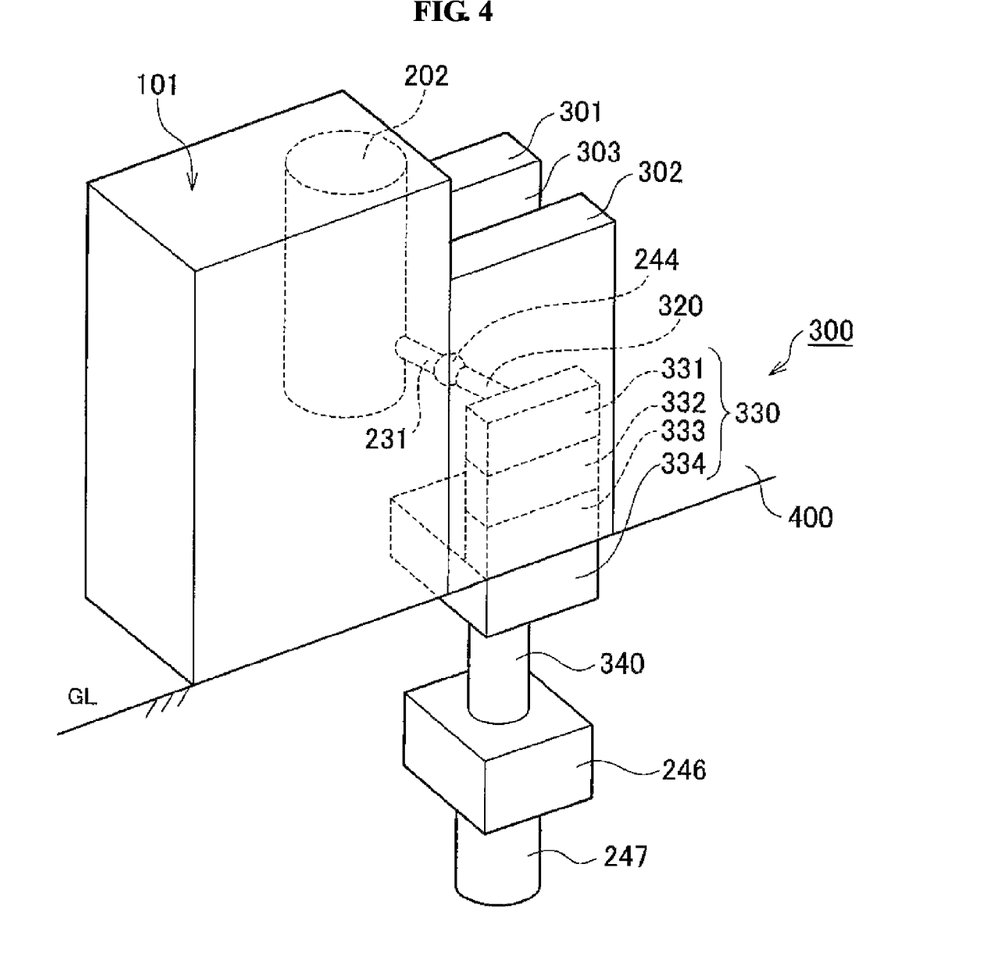
FIG. 4 is a perspective view schematically illustrating a substrate processing apparatus according to an embodiment of the present invention.

The exhaust system 300 will now be described in more detail. As described above, the exhaust pipe 231, the APC valve 244, the exhaust pipe 320, the exhaust pipe 330, the exhaust pipe 340, the vacuum pump 246 and the exhaust pipe 247 are sequentially installed in the exhaust system 300 from the upstream side (process chamber side) to the downstream side of the exhaust system 300. Referring to FIG. 4, the exhaust pipes 231, 320, 340 and 247 are round pipes each having a circular cross-section. Exhaust pipes 331 through 334 are sequentially installed at the exhaust pipe 330, from the upstream side to the downstream side of the exhaust pipe 330.

Figure 7:
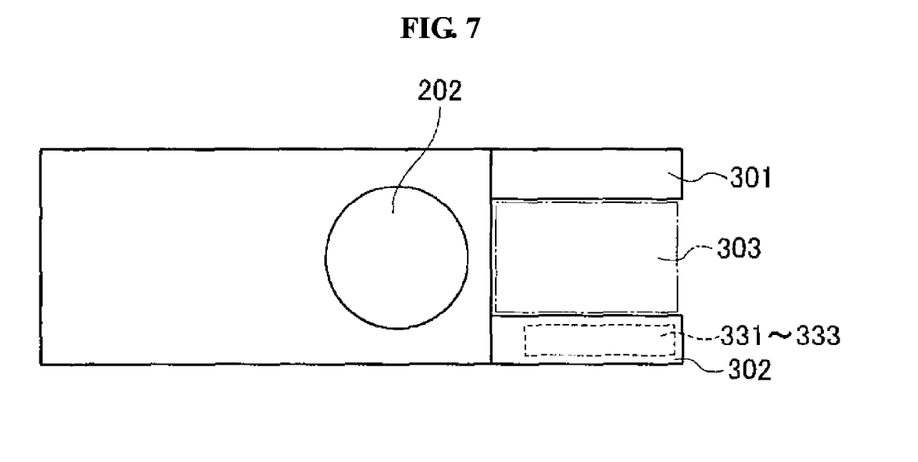
FIG. 7 is a plan view schematically illustrating a substrate processing apparatus according to an embodiment of the present invention.
Figure 8:
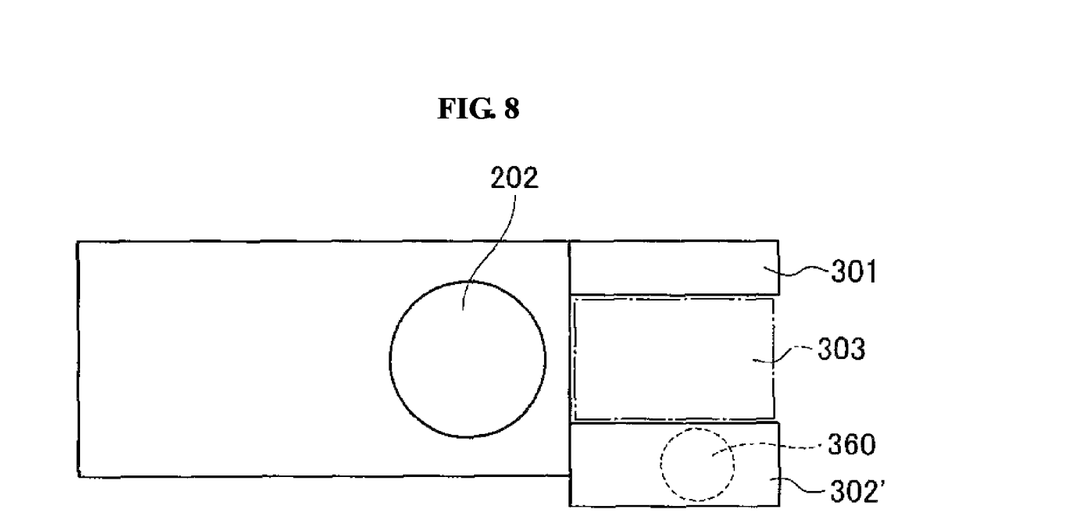
FIG. 8 is a plan view schematically illustrating a substrate processing apparatus according to a comparative example.
Figure 9:
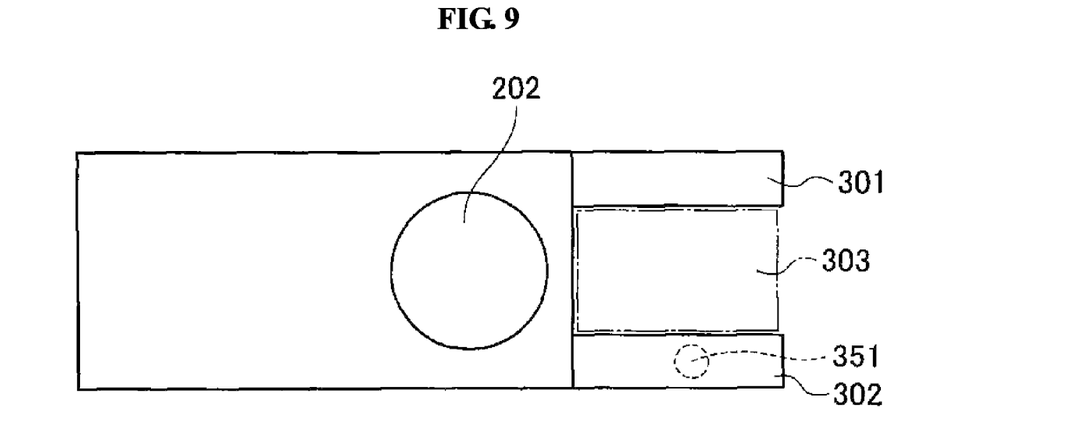
FIG. 9 is a plan view schematically illustrating a substrate processing apparatus according to another comparative example.

The exhaust pipes 331 through 333 have the same lateral cross-sections and are vertically stacked. The exhaust pipes 331 to 333 are rectangular-shaped pipes having rectangular cross-sections. Thus, even when the conductances of the exhaust pipes 331 through 333 increases by increasing the lateral cross-sectional areas thereof, the exhaust pipes 331 through 333 may be accommodated in the rear part 302 of the housing 111 of the substrate processing apparatus 101, and the footprint of the substrate processing apparatus 101 is not expanded (see FIG. 7). In contrast, when a circular pipe 360 having a circular cross-section is used and a lateral cross-sectional area of the circular pipe 360 is increased to increase the conductances thereof, a rear part 302' of the housing 111 needs to be expanded so as to accommodate the circular pipe 360 as illustrated in FIG. 8, thereby expanding the footprint of the substrate processing apparatus 101. According to the structure of the exhaust system 300, in case of supplying N2 at 30 slm, the inside pressure of the substrate processing apparatus may be reduced to several Pas to several tens of Pas when the square-shaped exhaust pipes 331 through 333 illustrated in FIG. 7 that may be accommodated in the rear part 302 of the housing 111 are used, compared to a circular pipe 351 illustrated in FIG. 9 that may be accommodated in the rear part 302 of the housing 111. As described above, by using the rectangular-shaped exhaust pipes 331 through 333, the conductance of the exhaust system 300 may be improved without increasing the footprint of the substrate processing apparatus 101, and the exhaust performance of the vacuum pump 246 is also improved. As a result, the inside pressure of the substrate processing apparatus 101 may be reduced without increasing the footprint of the substrate processing apparatus 101, and gas adsorption characteristics in regard to miniaturization of semiconductor device may be improved. In addition, the cross-sectional areas of the exhaust pipes 331 through 333 are determined by an amount of exhaust (destination pressure in the process chamber 201).

As described above, since, according to the present embodiment, the conductance of the exhaust system 300 may be improved, the amount of exhaust may be increased, and the pressure of the substrate processing apparatus 101 may be reduced. Therefore, the substrate processing apparatus 101 according to the present embodiment may be preferably used in an apparatus using a source gas having a low vapor pressure.

In addition, since an apparatus that performs plasma processing requires a low inside pressure, the substrate processing apparatus 101 according to the present embodiment may be used in the apparatus that performs plasma processing.

Figure 5:
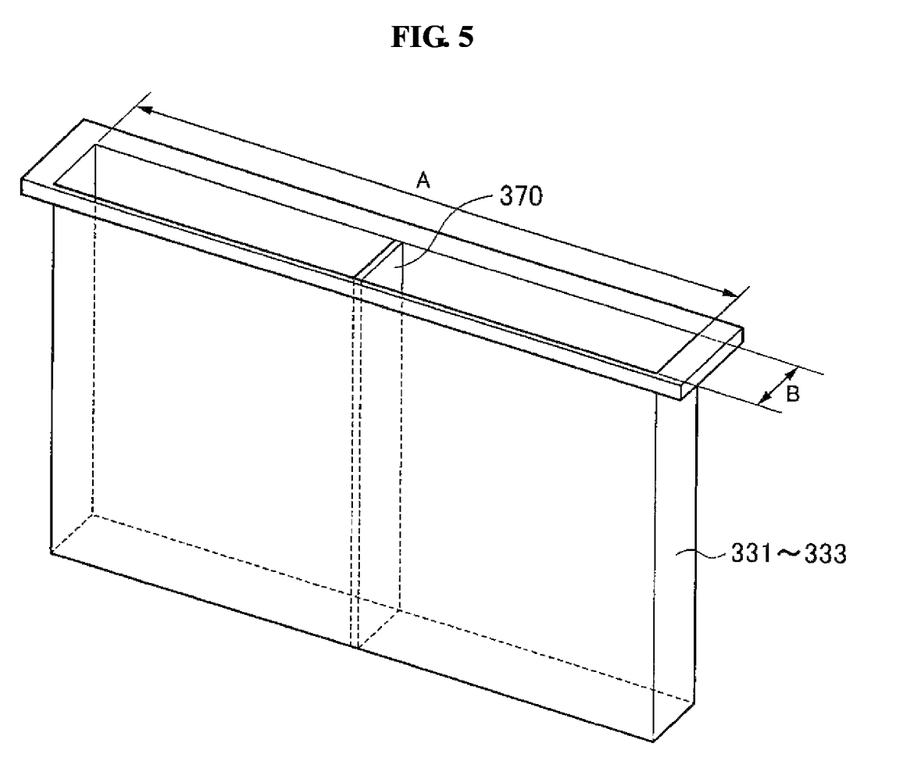
FIG. 5 is a perspective view schematically illustrating an exhaust pipe used in a substrate processing apparatus according to an embodiment of the present invention.

Referring to FIG. 5, an aspect ratio (a ratio between height A and width B=A/B) of each of the exhaust pipes 331 through 333 may be 8:1 or lower. Such aspect ratio is preferable because a desired destination pressure may be obtained while maintaining a width of the apparatus to be the same as that of a conventional apparatus wherein a circular pipe is used.

Figure 6:
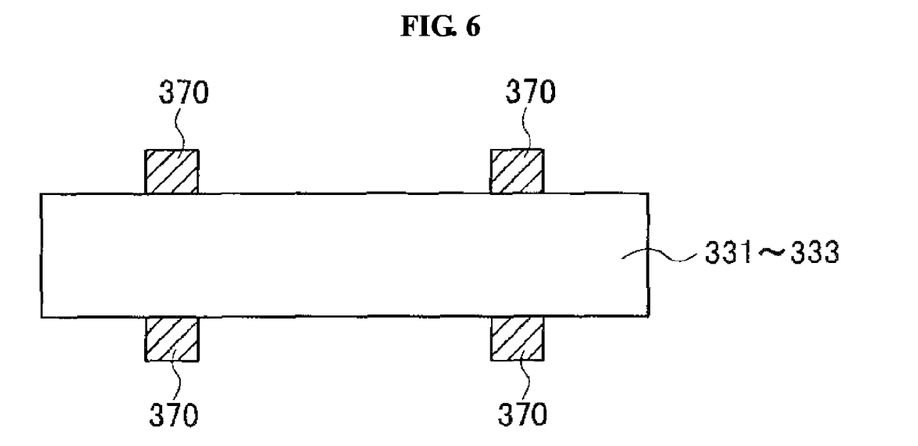
FIG. 6 is a perspective view schematically illustrating an exhaust pipe used in a substrate processing apparatus according to another embodiment of the present invention.

In addition, as illustrated in FIG. 5, each of the exhaust pipes 331 through 333 may include at least one rib 370 for reinforcement. The at least one rib 370 may be installed on inner sides of the exhaust pipes 331 through 333 as illustrated in FIG. 5 or may be installed on outer sides of the exhaust pipes 331 through 333 as illustrated in FIG. 6.

Since the housing 111 is installed on a floor 400 of a clean room, the exhaust pipes 331 through 333 accommodated in the rear part 302 of the housing 111 are also installed on the floor 400 of the clean room. Although the exhaust pipe 334 is also a rectangular-shaped exhaust pipe having a rectangular lateral cross-section, the exhaust pipe 334 is installed below the floor 400 of the clean room. Thus, the footprint of the substrate processing apparatus 101 is not directly influenced by the size of the exhaust pipe 334. The exhaust pipe 340 and the vacuum pump 246 are also installed below the floor 400 of the clean room. The exhaust pipe 247 is connected to a waste gas processing apparatus (not shown) installed outdoors via the floor 400 of the clean MOM.

The process furnace 202 is not directly connected to the rectangular-shaped exhaust pipe 330 (exhaust pipes 331 through 333) so that the process furnace 202 need not be taken out of the substrate processing apparatus 101 for setup or maintenance.

Although each of the lateral cross-sections of the exhaust pipes 331 through 333 is rectangular-shaped, the lateral cross-sections of the exhaust pipes 331 through 333 may be square-shaped or L-shaped. In this case, it is preferable that a rib is included on the inner or outer side of each of the exhaust pipes 331 through 333 for reinforcement.

Alternatively, exhaust pipes each having an oval cross-section may be used as the exhaust pipes 331 through 333. In this case, a rib may also be included on the inner or outer sides of the exhaust pipes 331 through 333 for reinforcement thereof.

As described above, the exhaust pipes 331 through 333 having rectangular-shaped or oval-shaped cross-sections perpendicular to an exhaust direction are preferable. In this case, it is preferable that a rib is included in the inner or outer side of each of the exhaust pipes 331 through 333 for reinforcement.

Next, a sequence of forming an insulating film, which may be preferably used for a capacitor of a dynamic random access memory (DRAM), on a substrate using the process furnace 202 of the substrate processing apparatus 101 described above will be described as a process included in a manufacturing process of a semiconductor apparatus (semiconductor device). In the following disclosure, operations of the elements of the substrate processing apparatus 101 are controlled by the controller 121.

A plurality of types of gases containing elements of a film that are to be formed are simultaneously supplied during chemical vapor deposition (CVD), and are alternately supplied during atomic layer deposition (ALD). A silicon nitride film (SiN film) or a silicon oxide film (SiO film) is formed by controlling supply conditions of a gas such as a gas supply flow rate, a gas supply time and plasma power. In the CVD and the ALD, the supply conditions are controlled such that a composition ratio of the SiN film satisfies (N/Si)≈1.33 which is a stoichiometric composition when the SiN film is formed for example, and that a composition ratio of the SiO film satisfies (O/Si)≈2 which is a stoichiometric composition when the SiO film is formed for example.

Alternatively, the supply conditions may be controlled such that a composition ratio of a film that is to be formed is different from a stoichiometric composition. In other words, the supply conditions may be controlled such that a composition of at least one of the elements of the film is beyond the range of a stoichiometric composition, compared to the other elements. As described above, a film may be formed while controlling a ratio of the elements of the film such as the composition ratio of the film.

Figure 10:
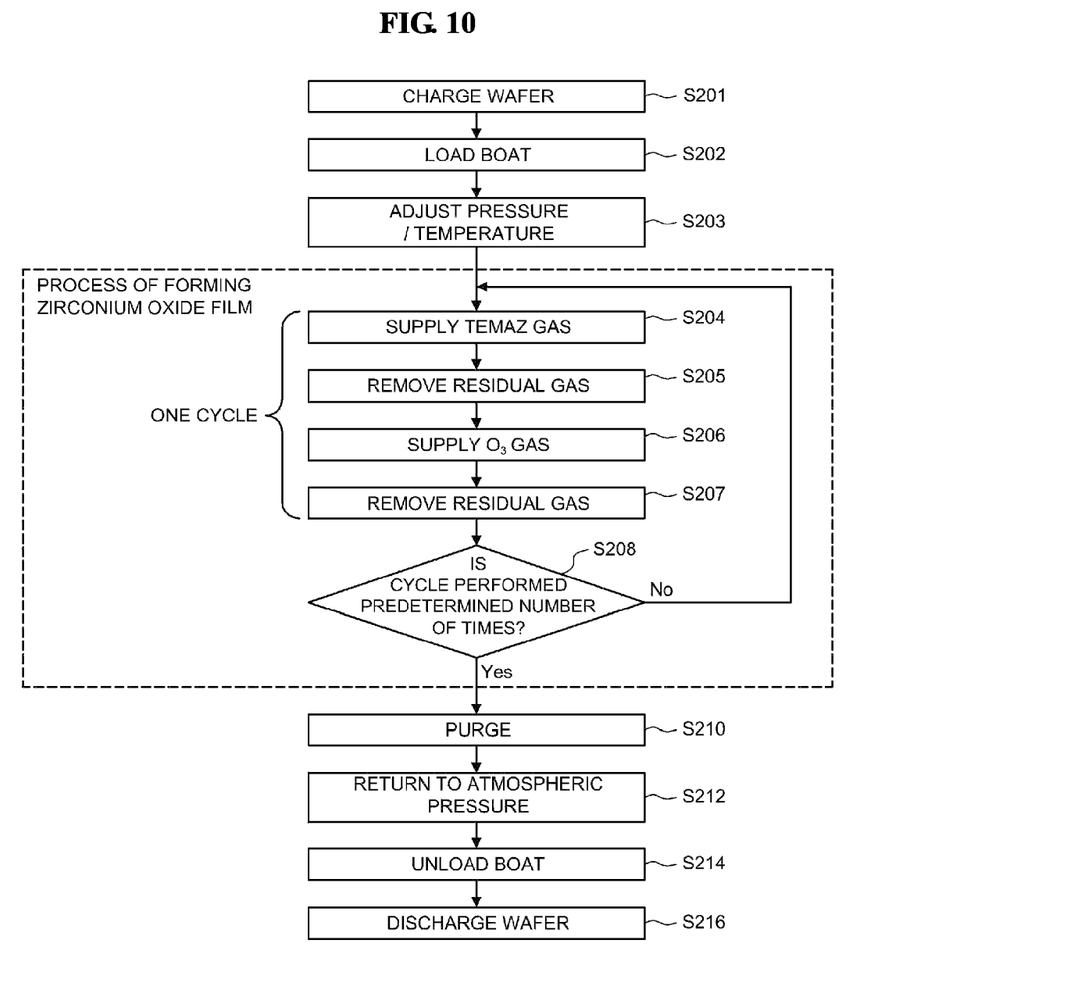
FIG. 10 is a flowchart illustrating a process of forming a zirconium oxide film using a substrate processing apparatus according to an embodiment of the present invention.
Figure 11:
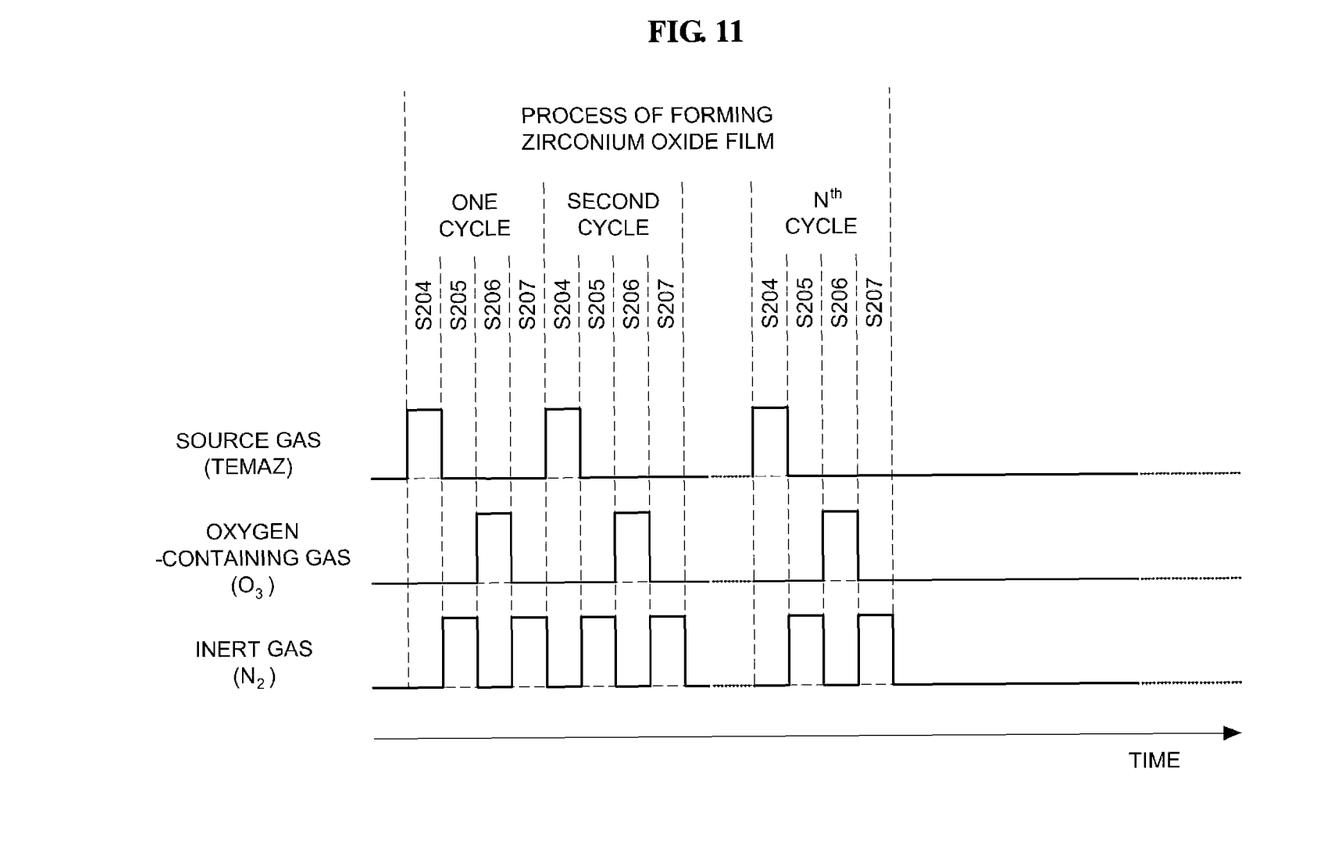
FIG. 11 is a timing chart illustrating a process of forming a zirconium oxide film using a substrate processing apparatus according to an embodiment of the present invention.

A sequence of forming a film (a ZrO2 film) including a stoichiometric composition as a high-k dielectric insulating film for a capacitor of a DRAM by alternately supplying two types of gases, e.g., TEMAZ gas and ozone (O3) gas, which contain two elements, e.g., zirconium (Zr) and oxygen (O), will now be described with reference to FIGS. 10 and 11.

The inside of the process chamber 201 is maintained at a predetermined temperature, e.g., 150° C. to 250° C., by controlling the heater 207.

Thereafter, after the plurality of wafers 200 are loaded into the boat 217 (wafer charging) (Step S201), the boat 217 supporting the plurality of wafers 200 is lifted by the boat elevator 115 and then loaded into the process chamber 201 (boat loading) (Step S202). The lower end of the reaction tube 203 is in a state of air-tight sealing by the seal cap 219 via the O-ring 220.

Thereafter, the inside of the process chamber 201 is vacuum-exhausted by the vacuum pump 246 to a desired pressure (degree of vacuum). The pressure in the process chamber 201 is measured by the pressure sensor 245, and the APC valve 244 is feedback-controlled based on the measured pressure (Step S203: pressure control). In addition, the inside of the process chamber 201 is heated to a desired temperature by the heater 207. The amount of current supplied to the heater 207 from the heating power source (not shown) is also feedback-controlled based on temperature information detected by the temperature sensor 263 so that the inside of the process chamber 201 has a desired temperature distribution (Step S203: temperature control). Thereafter, the boat 217 is rotated by the rotation mechanism 267, thus rotating the wafers 200.

Thereafter, a process of forming a ZrO2 film which is an insulating film by ALD is performed by supplying TEMAZ gas and ozone (O3) gas into the process chamber 201. The process of forming the ZrO2 film is performed by sequentially performing the following four steps.

Step S204

In Step S204, the TEMAZ gas is supplied first. By opening the valve 243a of the gas supply pipe 232a and closing the valve 243i of the vent line 232i, the TEMAZ gas is supplied into the gas supply pipe 232a via the vaporizer 271a. A flow rate of the TEMAZ gas flowing through the gas supply pipe 232a is controlled by the MFC 241a. The TEMAZ gas having the flow rate thereof controlled is supplied into the process chamber 201 via the gas supply holes 250a of the nozzle 249a, and, at the same time, is exhausted via the gas exhaust system 300. At the same time, an inert gas such as N2 gas, is supplied into the inert gas supply pipe 232e by opening the valve 243e. A flow rate of the N2 gas flowing through the inert gas supply pipe 232e is controlled by the MFC 241e. The N2 gas having the flow rate thereof controlled is supplied into the process chamber 201 together with the TEMAZ gas and exhausted via the gas exhaust system 300.

The pressure in the process chamber 201 is controlled to range, for example, from 50 to 400 Pa, by appropriately controlling the APC valve 244. The supply flow rate of the TEMAZ gas controlled by the MFC 241a is controlled to range from 0.1 to 0.5 g/min for example. A time period during which the wafer 200 is exposed to the TEMAZ gas, i.e., a gas supply time (irradiation time), is set to range from 30 to 240 seconds for example. The temperature of the heater 207 is set such that the temperature of the wafer 200 ranges from 150 to 250° C. for example.

By supplying the TEMAZ gas, a layer containing zirconium (Zr) is formed on a surface of the wafer 200. That is, a zirconium (Zr) layer may be formed as a zirconium (Zr)-containing layer on the wafer 200 having a thickness of less than one atomic layer to several atomic layers. The zirconium (Zr)-containing layer may be a chemical adsorption (surface adsorption) layer of the TEMAZ gas. Zirconium (Zr) is an element having only a solid state. Here, examples of the zirconium (Zr) layer may include a continuous layer, a discontinuous layer or a thin film formed by overlapping the continuous layer and the discontinuous layer. The continuous layer including zirconium (Zr) may also be referred to as a thin film. Examples of the chemical adsorption layer of the TEMAZ gas may include not only continuous chemical adsorption layers including gas molecules of the TEMAZ gas but also discontinuous chemical adsorption layers including the gas molecules of the TEMAZ gas. When the thickness of the zirconium (Zr) layer formed on the wafer 200 exceeds several atomic layers, the oxidization process performed in Step 206 which will be described later is not delivered to the entire zirconium-containing layer. A minimum thickness of the zirconium-containing layer that may be formed on the wafer 200 is less than one atomic layer. Thus, the zirconium-containing layer may have a thickness ranging from less than one atomic layer to several atomic layers. In addition, conditions such as the temperature of the wafer 200 and the inside pressure of the process chamber 201 may be controlled such that a zirconium (Zr) layer is formed by depositing zirconium (Zr) on the wafer 200 under conditions where the TEMAZ gas is self-decomposed, and that a chemical adsorption layer of the TEMAZ gas is formed by chemically adsorbing the TEMAZ gas onto the wafer 200 under conditions where the TEMAZ gas is not self-decomposed. In addition, a film-forming rate of the zirconium (Zr) layer on the wafer 200 may be higher than that that of the chemical adsorption layer of the TEMAZ gas. In addition, a film may be more densely formed when the zirconium (Zr) layer is formed on the wafer 200 than when the chemical adsorption layer of the TEMAZ gas is formed on the wafer 200.

Step S205

In Step S205, after the zirconium-containing layer is formed, the valve 243a is closed and the valve 243i is opened to suspend the supply of the TEMAZ gas into the process chamber 201 and to flow the TEMAZ gas into the vent line 232i. The inside of the process vacuum 201 is vacuum-exhausted by the vacuum pump 246 by opening the APC valve 244 of the gas exhaust system 300, thereby removing non-reacted or residual TEMAZ gas remaining in the process chamber 201 from the process chamber 201 after the zirconium-containing layer is formed. In addition, N2 gas is continuously supplied into the process chamber 201 by opening the valve 243e. By continuously supplying the N2 gas into the process chamber 201, the non-reacted or residual TEMAZ gas remaining in the process chamber 201 after the zirconium-containing layer is formed may be efficiently removed from the process chamber 201. A rare gas such as argon (Ar) gas, helium (He) gas, neon (Ne) gas or xenon (Xe) gas may be used as an inert gas instead of the N2 gas.

Step S206

In Step S206, after the residual gas is removed from the process chamber 201, O2 gas is supplied into the gas supply pipe 232b. The O2 gas flowing through the gas supply pipe 232b is changed into O3 gas by the ozonizer 500. By opening the valves 243c and 243b of the gas supply pipe 232b and closing the valve 243h of the vent line 232h, the O3 gas is supplied into the process chamber via the gas supply holes 250b of the nozzle 249b while controlling a flow rate of the O3 gas flowing through the gas supply pipe 232b by the MFC 241d, and at the same time, is exhausted via the gas exhaust system 300. At the same time, N2 gas is supplied into the inert gas supply pipe 232f by opening the valve 243f. The N2 gas is supplied into the process chamber 201 together with the O3 gas, and at the same time, is exhausted via the gas exhaust system 300.

When the O3 gas is supplied, the APC valve 244 is appropriately controlled such that the inner pressure of the process chamber 201 may range from 50 to 400 Pa for example. A supply flow rate of the O3 gas controlled by the MFC 241b may range from 10 to 20 slm for example. A time period during which the wafer 200 is exposed to the O3 gas, i.e., a gas supply time (irradiation time), may range from 60 to 300 seconds for example. The temperature of the heater 207 is set such that the temperature of the wafer 200 ranges from 150 to 250° C. similar to Step S204.

The gas supplied into the process chamber 201 is O3 gas and the TEMAZ gas is not supplied into the process chamber 201. Thus, the O3 gas reacts with a portion of the zirconium-containing layer formed on the wafer 200 in Step S204 without causing a gaseous reaction. Accordingly, the zirconium-containing layer is oxidized and modified into a layer containing zirconium and oxygen, i.e., a zirconium oxide (ZrO2) layer.

Step S207

In Step S207, the valve 243b of the gas supply pipe 232b is closed and the valve 243h is opened to suspend the supply of the O3 gas into the process chamber 201 and to supply the O3 gas into the vent line 232h. The inside of the process chamber 201 is vacuum-exhausted by the vacuum pump 246 by opening the APC valve 244 of the gas exhaust system 300, thereby removing non-reacted or residual O3 gas remaining in the process chamber 201 from the process chamber 201 after an oxidization process is performed. In addition, N2 gas is continuously supplied into the process chamber 201 by opening the valve 243f. By continuously supplying the N2 gas into the process chamber 201, the non-reacted or residual O3 gas remaining in the process chamber 201 after the oxidization process is performed may be efficiently removed from the process chamber 201. O2 gas may be used as an oxygen-containing gas instead of the O3 gas.

An insulating film containing zirconium and oxygen, i.e., a ZrO2 film, may be formed on the wafer 200 to a predetermined thickness by performing the cycle including Steps S204 through S207 at least once (Step S208).

After the formation of the ZrO2 film having the predetermined thickness, the valves 243e and valve 243f are opened to supply an inert gas such as N2 gas into the inert gas supply pipes 232e and 232f, and the inside of the process chamber 201 is purged with the inert gas by exhausting the process chamber 201 while supplying the inert gas such as the N2 gas, into the process chamber 201 (gas purging: Step S210). Thereafter, an atmosphere in the process chamber 201 is replaced with the inert gas (replacement of inert gas), and the pressure in the process chamber 201 is returned to a atmospheric pressure (atmosphere pressure recovery: Step S212). Thereafter, the seal cap 219 is moved downward by the boat elevator 115 to open the lower end of the reaction tube 203, and at the same time, the processed wafer 200 supported by the boat 217 is unloaded from the process chamber 201 through the lower end of the reaction tube 203 (boat unloading: Step S214). Thereafter, the processed wafer 200 is discharged from the boat 217 (wafer discharging: Step S216).

According to the present invention, a substrate processing apparatus with the increase conductance of the exhaust system while preventing or suppressing the increase in footprint thereof, thereby reducing the inner pressure thereof

EXEMPLARY EMBODIMENTS OF THE PRESENT INVENTION

Exemplary embodiments of the present invention are supplementarily noted.

Supplementary Note 1

According to an embodiment of the present invention, a substrate processing apparatus includes a process container configured to accommodate a plurality of substrates; a process gas supply unit configured to supply a process gas into the process container to process the plurality of substrates; and an exhaust unit configured to exhaust the process container. The exhaust unit includes a vacuum pump and exhaust pipes configured to connect the process container and the vacuum pump. At least a portion of the exhaust pipes has a rib structure, and cross-sections of the exhaust pipes perpendicular to an exhaust direction include rectangular or oval shaped portions.

Supplementary Note 2

In the substrate processing apparatus described in Supplementary Note 1, the at least a portion of the exhaust pipes may have a rib structure and cross-sections of the exhaust pipes perpendicular to the exhaust direction may have a rectangular or oval shape.

Supplementary Note 3

In the substrate processing apparatus described in Supplementary Note 1, the at least a portion of the exhaust pipes may have a rib structure, and cross-sections of the exhaust pipes perpendicular to the exhaust direction may have a rectangular shape.

Supplementary Note 4

In the substrate processing apparatus described in Supplementary Note 1, an aspect ratio of the rectangular cross-section may be 8:1 or lower.

Supplementary Note 5

In the substrate processing apparatus described in one of Supplementary Notes 1 through 4, the process gas supply unit is configured to form a high-k dielectric film by alternately supplying two types of process gases into the process container.

While this invention has been particularly shown and described with reference to exemplary embodiments thereof, it will be understood by those of ordinary skill in the art that various changes in form and details may be made therein without departing from the spirit and scope of the invention as defined by the appended claims.

What is claimed is:

1. A method of manufacturing a semiconductor device, comprising:
   (a) processing a substrate accommodated in a process container accommodated in a housing by supplying a process gas onto the substrate; and
   (b) exhausting the process container using an exhaust system comprising a first exhaust pipe connected to the process container, the first exhaust pipe having circular or oval cross-section perpendicular to an exhausting direction thereof; and a second exhaust pipe connected to the first exhaust pipe, the second exhaust pipe extending downward in a vertical direction and having square or rectangular cross-section perpendicular to the exhausting direction, wherein at least a portion of the second exhaust pipe is disposed within a pipe accommodating part of the housing having a rectangular horizontal cross-section, wherein an aspect ratio of the cross-section of the pipe accommodating part is substantially the same as that of the cross-section of the second exhaust pipe.

2. The method of claim 1, wherein at least a portion of the second exhaust pipe comprises a rib structure.

3. The method of claim 2, wherein at least one of the at least two types of process gases comprises a gas having a low vapor pressure.

4. The method of claim 1, wherein (a) comprises alternately and repeatedly supplying at least two types of process gases into the process container without mixing the at least two types of process gases to form a film on the substrate.

5. The method of claim 4, wherein the film comprises a high-k dielectric film.

6. The method of claim 1, wherein the exhaust system further comprising: a third exhaust pipe connected to the second exhaust pipe and disposed outside the housing wherein an area of a cross-section of the third exhaust pipe is larger than that of the cross-section of the second exhaust pipe.

* * * * *